(12) United States Patent
Ke et al.

(10) Patent No.: US 11,051,424 B2
(45) Date of Patent: Jun. 29, 2021

(54) FAN AND POWER SUPPLY DEVICE

(71) Applicant: Delta Electronics, Inc., Taoyuan (CN)

(72) Inventors: Zhongwei Ke, Taoyuan (CN); Jun Yang, Taoyuan (CN); Hongming Li, Taoyuan (CN); Junlai Huang, Taoyuan (CN)

(73) Assignee: DELTA ELECTRONICS INC., Taoyuan (CN)

( * ) Notice: Subject to any disclaimer, the term of this patent is extended or adjusted under 35 U.S.C. 154(b) by 0 days.

(21) Appl. No.: 16/426,033

(22) Filed: May 30, 2019

(65) Prior Publication Data
US 2019/0373767 A1 Dec. 5, 2019

(30) Foreign Application Priority Data

May 31, 2018 (CN) .......................... 201820847609.6
May 31, 2018 (CN) .......................... 201820847630.6

(51) Int. Cl.
*H05K 7/20* (2006.01)
*G06F 1/20* (2006.01)
*G06F 1/3203* (2019.01)

(52) U.S. Cl.
CPC ........... *H05K 7/20172* (2013.01); *G06F 1/20* (2013.01); *G06F 1/3203* (2013.01)

(58) Field of Classification Search
CPC ........... H05K 7/20172; H05K 7/20145; H05K 1/0203; H05K 7/2089; G06F 1/20; G06F 1/206; G06F 1/3203; G06F 2200/20

USPC ..... 361/695, 697, 704, 679.48; 257/E23.099
See application file for complete search history.

(56) References Cited

U.S. PATENT DOCUMENTS

| | | | | |
|---|---|---|---|---|
| 6,700,778 B1* | 3/2004 | Wang | ........................ | G06F 1/20 174/16.1 |
| 7,108,051 B2* | 9/2006 | Hung | ........................ | G06F 1/20 165/122 |
| 7,254,020 B2* | 8/2007 | Lee | ..................... | H05K 7/20172 165/122 |
| 2008/0117569 A1* | 5/2008 | Lee | ..................... | H05K 7/20145 361/678 |
| 2010/0129235 A1 | 5/2010 | Qian | | |
| 2016/0017895 A1* | 1/2016 | Chang | ................... | F04D 29/522 415/119 |

FOREIGN PATENT DOCUMENTS

CN 205025805 U 2/2016

* cited by examiner

*Primary Examiner* — Mandeep S Buttar
(74) *Attorney, Agent, or Firm* — Qinghong Xu

(57) ABSTRACT

This disclosure provides a fan for a power supply and a power supply device. The power supply includes an outer casing with four sides, and the four sides form four corners. Wherein the fan includes a fan frame, and a reserved space is formed by any one of the corners of the outer casing and an outer surface of the fan frame at the corresponding position; and the fan frame further has positioning holes at the other three corners of the outer casing to fix and connect with the outer casing.

5 Claims, 8 Drawing Sheets

FAN AND POWER SUPPLY DEVICE

CROSS REFERENCE

This application is based upon and claims priority to Chinese Patent Application No. 201820847609.6, flied on May 31, 2018; and No. and 201820847630.6, filed on May 31, 2018, the entire contents thereof are incorporated herein by reference.

TECHNICAL FIELD

The present disclosure relates to a fan and a power supply device.

BACKGROUND

With rapid development of cloud computing and artificial intelligence (AI), the system power demand is increasing in networking and server application, but the space for the power supply reserved in a system is getting smaller, especially in the direction of the width of the power supply. Wherein, the width of the power supply is limited to the size of a built-in fan. Usually, a fan with smaller width than the width of the power supply is selected to leave a path for the wires inside the power supply. However, the small width power supply is more challenge for thermal cooling due to large airflow resistance in side; on the other hand, the smaller width fan, the lower airflow capability, which can't improve power density to meet system power requirement.

Besides, in some application, for example, in networking and server application, the power supply has strict or standard height and width, the space for installing devices, for example the fan, the socket, the LED, etc., on the front panel of the power supply is also limited. Generally, the type of the socket needs to match the input power of the power supply. With the increase of the power, the socket with smaller-level power cannot meet the requirements of higher power, and the socket with higher-level power can meet the requirements for current carrying capacity of the power supply, but the size of such socket will be much larger, and thereby causing no space to install other device for example, LED, on the front panel of the existing power supply.

Thus, in the context of increasing power density of the power supply, how to utilize the limited space to the most extent is an urgent problem for the power supply industry.

It should be noted that the Background portion contains the contents which are merely used to reinforce understanding of the background technology of the present disclosure, and thus may include information that does not constitute the related art as already known by an ordinary person skilled in the art.

SUMMARY

One aspect of the present disclosure is provided a fan for a power supply, the power supply includes an outer casing with four sides, the four sides form four corners. Wherein the fan includes a fan frame, and a reserved space is formed by any one of the four corners of the outer casing and an outer surface of the fan frame at the corresponding position; and the fan frame is further provided with positioning holes at the other corners of the outer casing to assemble with the outer casing.

Another aspect of the present disclosure is provided a fan for a power supply, the power supply includes an outer casing with four sides, the four sides form four corners. Wherein the fan includes a fan frame, and two reserved spaces are formed by any two of the four corners of the outer casing and outer surface of the fan frame at the corresponding position; and the fan frame is further provided with positioning holes at the other corners of the outer casing to assemble with the outer casing.

Another aspect of the present disclosure is provided a power supply device. The power supply device includes an outer casing with four sides, and the four sides form four corners; a fan, a central axis of which being parallel to an extending direction of the outer casing, and the fan is placed in the outer casing to divide the power supply device into a first part and a second part; wherein, the fan includes a fan frame, and a reserved space is formed by any one of the four corners of the outer casing and an outer surface of the fan frame at the corresponding position; and the fan frame is also provided with positioning holes at the other corners of the outer casing to assemble with the outer casing; a wire, which is connected to the second part from the first pail of the power supply device through the reserved space.

Another aspect of the present disclosure is provided a power supply device. The power supply device includes an outer casing, a fan and a light-emitting unit. The outer casing has four sides and a front panel, and the four sides form four corners. The fan is fixed and attached to the front panel, wherein, the fan includes a fan frame, and a reserved space is formed by any one of the four corners of the outer casing and an outer surface of the fan frame at the corresponding position; and the fan frame is also provided with positioning holes at the other corners of the outer casing to assemble with the outer casing. The light-emitting unit is disposed in the reserved space, and a light-transmitting hole is disposed at a position of the front panel corresponding to the light-emitting unit.

BRIEF DESCRIPTION OF THE DRAWINGS

The foregoing and other features, and advantages of this disclosure will become more apparent from the following detailed description of the exemplary embodiments when taken in conjunction with the accompanying drawings.

DETAILED DESCRIPTION

Figure 1:
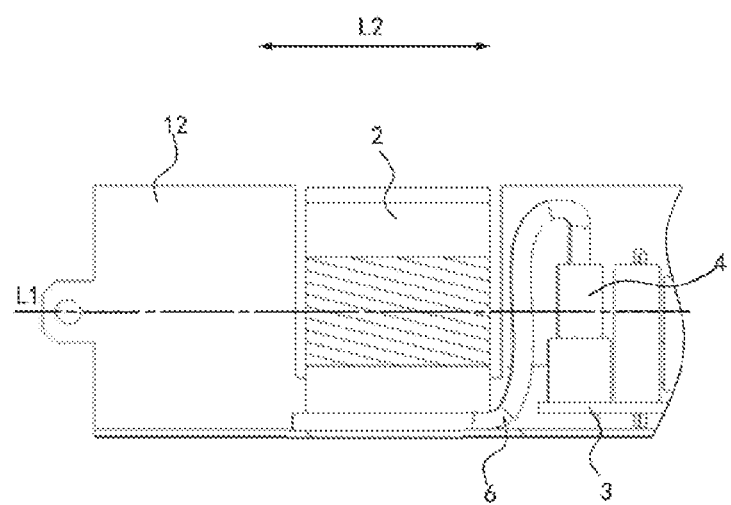
FIG. 1 is a schematic structural view of a power supply device of the present disclosure.

Now, the exemplary embodiments will be described more completely with reference to the accompanying drawings.

However, the exemplary embodiments can be done in various forms and should not be construed as limiting the embodiments as set forth herein. Instead, these embodiments are provided so that this disclosure will be thorough and complete, and concept of the exemplary embodiment will be fully conveyed to those skilled in the art. Same reference numbers denote the same or similar structures in the drawings, and thus the detailed description thereof will be omitted.

The present disclose provides a fan, which is designed to adapt to a small-sized power supply without reducing air volume and air pressure characteristics of the fan, and solves a problem of path for the wires, and thereby can greatly improve the power density of the power supply. Or, the fan is used in, for example, a CRPS power supply, to solve a problem of the reserved space for the light emitting device.

One Embodiment of the Fan

Figure 2:
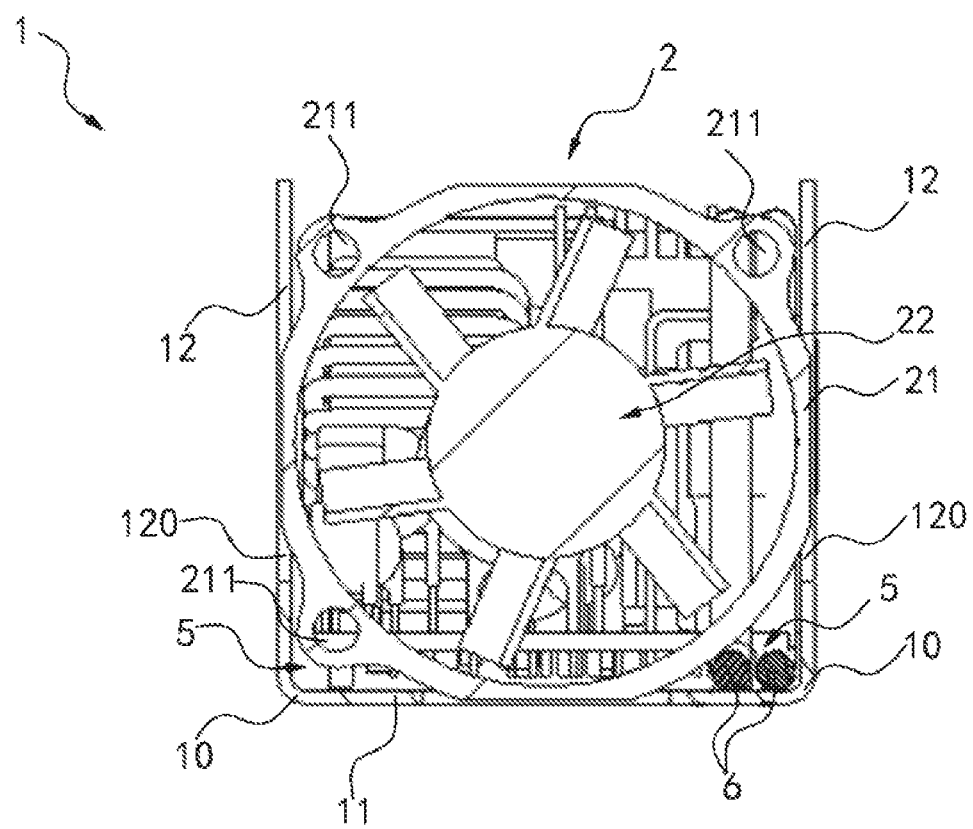
FIG. 2 is a left-side view of FIG. 1, showing a structure of one embodiment of the fan according to the present disclosure.

Referring to FIG. 1-2, FIG. 1 is a schematic structural view of the power supply device of the present disclosure. FIG. 2 is a left-side view of FIG. 1, showing the structure of one embodiment of the fan according to the present disclosure.

As shown in FIG. 1-2, the power supply device of the present disclosure includes an outer casing 1, a fan 2 and a main plate 3. The outer casing 1 has four sides, which may be, for example, a bottom panel 11, two side panels 12 connected to the bottom panel 11 and disposed opposite to each other, and a top cover (not shown) disposed on the top ends of the two side panels 12. Every two of the four sides of the outer casing 1 are joined together to form a corner 10, and four sides of the outer casing 1 form all four corners 10. The main plate 3 may be mounted on the bottom wall 11, and the electronic component 4 is mounted on the main plate 3.

As shown in FIG. 2, the fan 2 includes a fan frame 21 and an impeller 22 disposed within the fan frame 21.

The fan frame 21 is, for example, substantially circular, wherein a reserved space 5 is formed by any one of the corners 10 of the outer casing 1 of the power supply and an outer surface of the fan frame 21 at the corresponding position. The outer surface of the fan frame 21 for defining the reserved space 5 may be a circular arc surface, or may be an inclined plane or multiple inclined planes sequentially connected end to end. In some other embodiments, the outer surface of the fan frame at the reserved space may be other shape and is not particularly limited in the present disclosure. The reserved space 5 may be used for setting LED(s) (not shown) or for arranging wires in the power supply. The reserved space 5 in FIG. 2 is positioned at the lower right corner of the outer casing 1 of the power supply, but not limited thereto in the present disclosure. In some other embodiments, the reserved space 5 may also be disposed at the other three corners 10.

Further, as shown in FIG. 2, the fan frame 21 is further provided with positioning holes 211 at the other three corners 10 of the outer casing 1. The fan 2 may be conveniently mounted in the outer casing by the positioning holes 211 and positioning members such as bolts.

In some embodiments, the size of the fan may be 40 mm*40 mm, 38 mm*38 mm, 36 mm*36 mm.

For the improvement of the fan frame, the corners of the outer casing of the power supply and the outer surface of the fan frame at the corresponding position together form one or two reserved spaces, that is, a space for wires to pass through or accommodating a light-emitting device is provided when the maximum width of the fan perpendicular to the central axis is invariant, so that the fan can be used in the power supply device with smaller-size, such as a 1 U power supply, without reducing the heat dissipation performance, thereby the power density of the power supply will be improved.

Another Embodiment of the Fan

Figure 3:
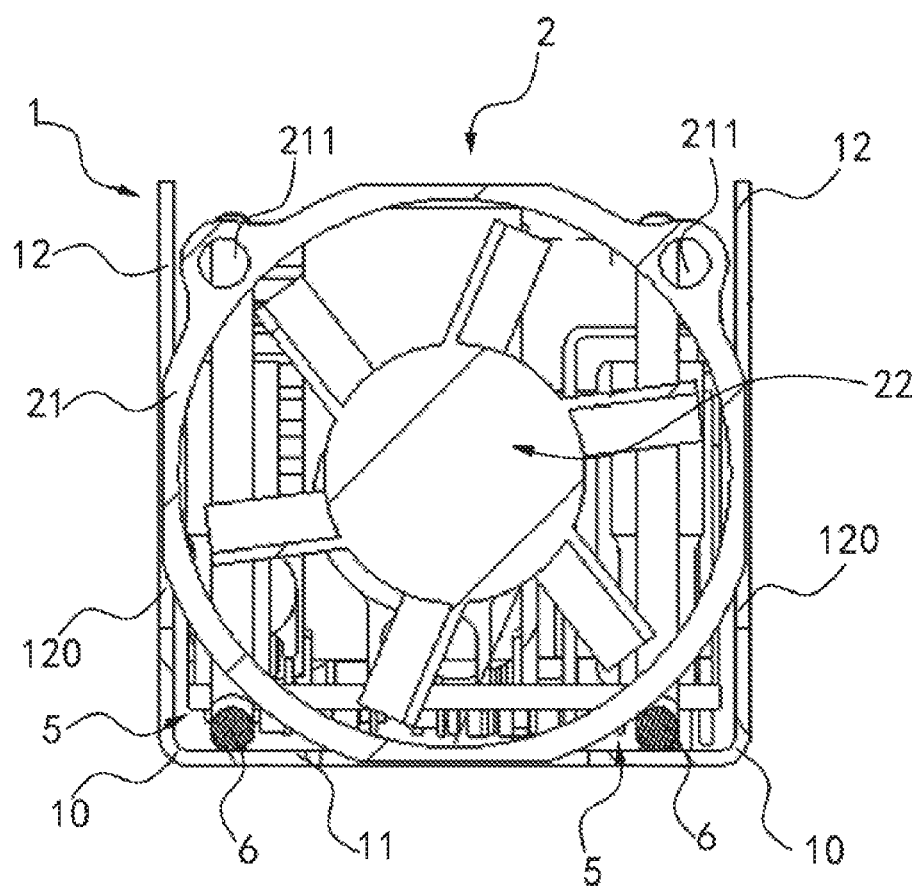
FIG. 3 is a left-side view of FIG. 1, showing a structure of another embodiment of the fan according to the present disclosure.
Figure 4:
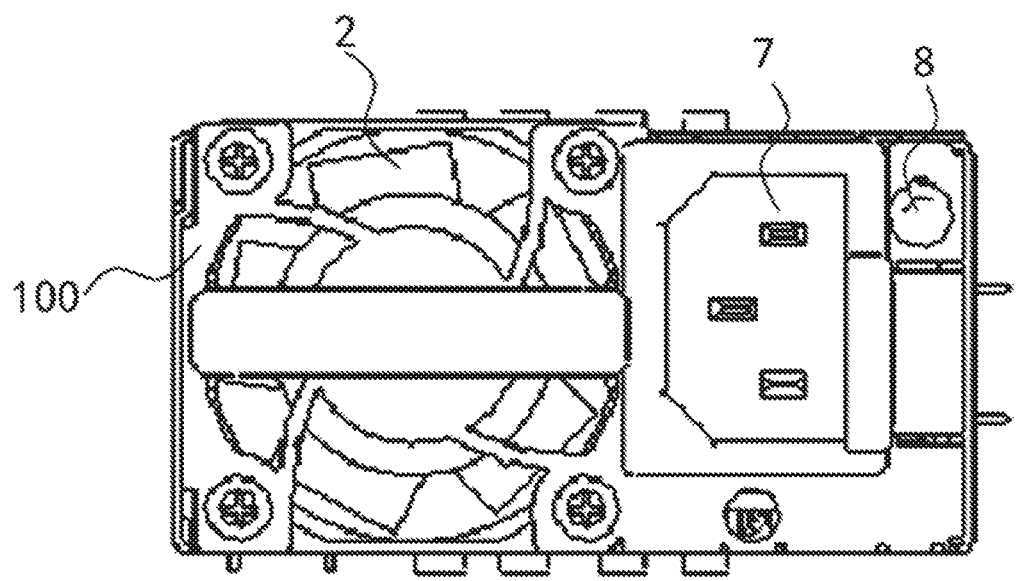
FIG. 4 shows a typical layout of the front panel of the CRPS power supply in the prior art.

Referring to FIG. 3, FIG. 3 is a left-side view of FIG. 1, showing the structure of another embodiment of the fan according to the present disclosure, which differs from the previous embodiment of the fan in that:

As shown in FIG. 3, the fan 2 may be provided with two reserved spaces 5. In detail, any two corners 10 (for example, a lower left corner and a lower right corner) of the outer casing 1 and the respective outer surfaces of the fan frame 21 at the corresponding positions form two reserved spaces 5, respectively; two positioning holes 211 may be disposed on the fan frame 21 at the position corresponding to the other two corners 10 (for example, an upper left corner and an upper right corner), and conveniently, the fan 2 may be mounted to the outer casing 1 through the positioning holes 211 and the positioning members such as bolts.

The other structures of the another embodiment of the fan are substantially same as those of the one embodiment, here, the details will be omitted.

One Embodiment of the Power Supply Device

As shown in FIG. 1, the fan 2 is placed in the outer casing 1. Further, the outer casing 1 of the power supply has four openings 120, so that the edge of the fan frame 21 can be embedded into the openings 120 to make the structure of the power supply device more compact. Wherein, the fan 2 has a central axis L1 parallel to an extending direction L2 of the outer casing 1, and divides the power supply device into a first part and a second part, for example the left part and the right part as shown in FIG. 1; and a wire 6 is connected to the second part after passing through the first part of the power supply device.

In some embodiments, the cross section of the power supply device perpendicular to the extending direction of the outer casing 1 is a square. For example, the power supply device may be a 1 U power supply or a 1.5 U power supply. Further, the power supply device may be a 1 U power supply of 40.6 mm*40.6 mm.

In some embodiments, a socket (not shown) may be mounted on the first part of the power supply device, and the main plate 3 may be mounted on the second part. Wherein, the wire 6 includes two input power supply lines drawn from the socket. The wire 6 needs to be electrically connected to main plate 3 or the electronic component 4 on the main plate 3 through the reserved space 5. The two input power supply lines may pass through one reserved space 5, or in the case of two reserved space 5, the two input power supply lines may also pass through the two different reserved spaces 5, respectively.

In some other embodiments, the wire 6 is not limited to the input power supply line, and may also be signal lines. Similarly, a plurality of signal lines may pass through one reserved space 5, or pass through the two different reserved spaces 5 respectively.

In some other embodiments, the input power supply lines may pass through one reserved space 5, and the signal lines may pass through the other reserved space 5.

On the other hand, as shown in 4, it shows a typical layout of the front panel of the CRPS power supply in the prior art. The fan 2, socket 7 and the light-emitting unit 8 are mounted side by side on the front panel 100 of the outer casing. Since the CRPS power supply has standard height and width, the space for installing the device on the front panel 100 is also limited. With the increasing of the power, the type of the socket should be chosen to match with the power. With increase of the size of the socket, there will be no space to install other device for example, light-emitting unit.

Another Embodiment of the Power Supply Device

Figure 5:
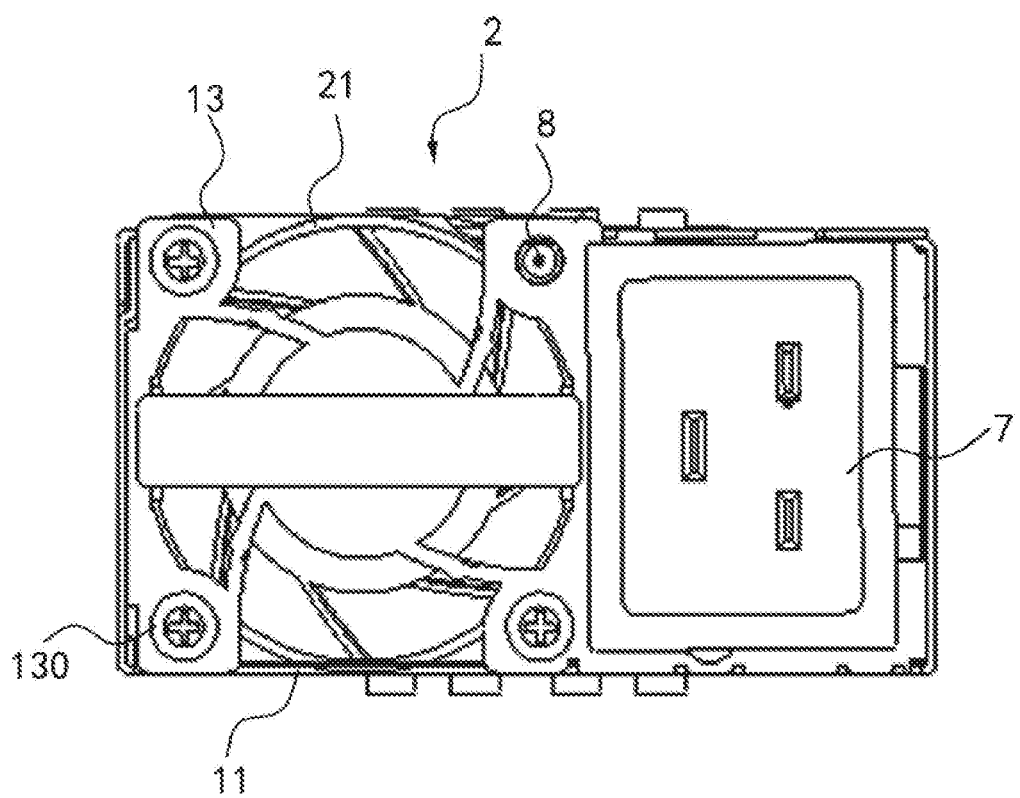
FIG. 5 is a schematic structural diagram of another embodiments of the power supply device according to the present disclosure.

As shown in FIG. 5, FIG. 5 is a schematic structural diagram of another embodiments of the power supply device according to the present disclosure. In some embodiments, for example, the CRPS power supply with size of 3.5 mm*38.5 mm may be provided.

As shown in FIG. 5, the power supply device includes a light-emitting unit 8. Wherein, a front panel 13 is secured to a front end of the outer casing 1, and the fan 2 is fixed and attached to the front panel 13. For example, the front panel 13 is provided with positioning holes 130, the fan 2 is fixed with the front panel 13 by means of a positioning member through the positioning hole 211 and the positioning hole 130.

The light-emitting unit 8 may be a single color LED or a two-color LED. The LED is disposed in the reserved space 5, and a light-transmitting hole is disposed on a position of the front panel 13 corresponding to the position of the light-emitting unit 8. In some embodiments, the positioning holes 130 can serve as the light-transmitting hole. Further, the power supply device may only have one LED, and also may include two LEDs that are respectively placed in different reserved spaces, of course, the present disclosure is not limited thereto.

Further, in some embodiments, the power supply device further includes a socket 7 installed on the front panel 13 of the power supply device and adjacent to the fan 2.

The other structures in the embodiment of the power supply device is substantially same as that in the first embodiment, here, the details will be omitted.

Further, the size of the socket generally needs to match with an input power of the power supply. With the increase of the power of the power supply, the socket with smaller-size cannot meet the need for using the power supply any longer, and using the socket with higher-level power can meet the need for a current carrying capacity of the power supply, but the size of such socket will be increased a lot, and thereby causing no space to install the light-emitting unit on the front panel of the existing power supply.

So a further fan is provided in the present disclosure, by placing the LED in the through hole of the fan frame, which can promote light-emitting function, in particular, for the switch power supply with limited installation space, and can help to increase the power density of the power supply, without increasing the size of the power supply.

A Further Embodiment of the Fan

Figure 6:
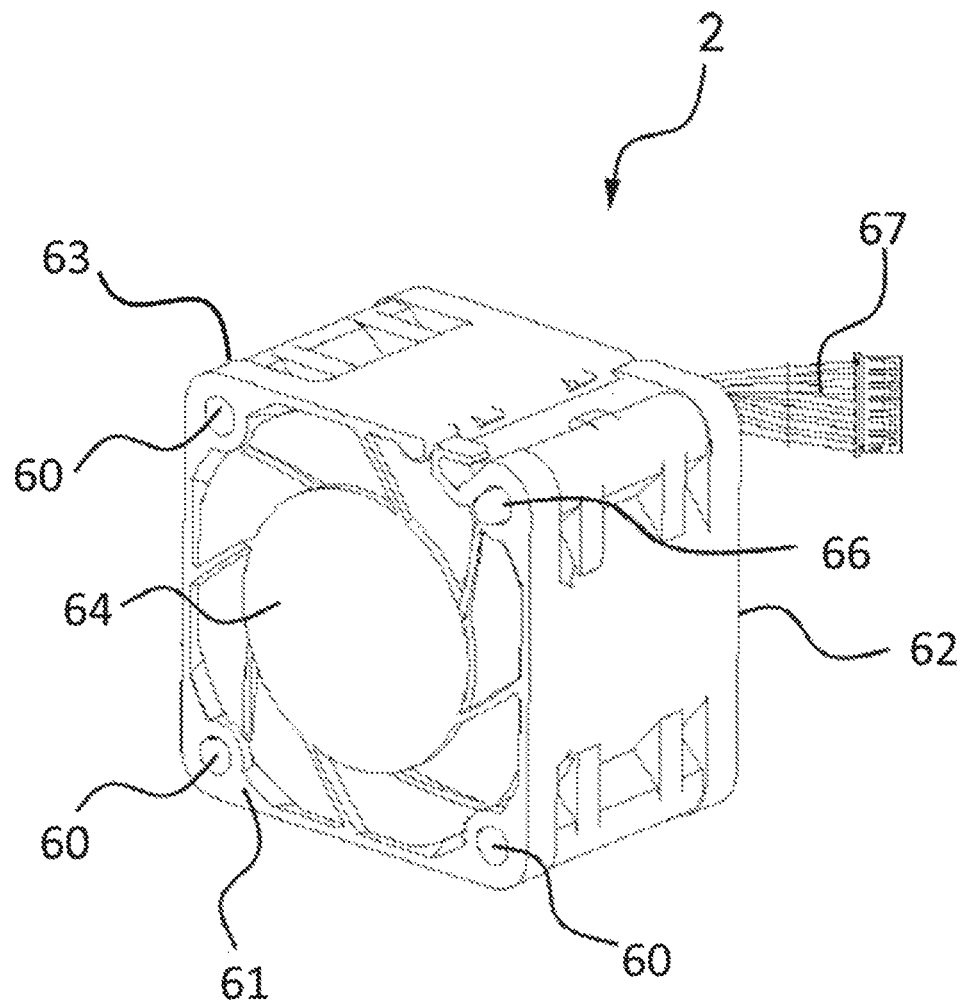
FIG. 6 is a schematic perspective structural view of a further embodiment of the fan according to the present disclosure.

Referring to FIG. 6, FIG. 6 is a schematic perspective structural view of a further embodiment of the fan of the present disclosure. As shown in FIG. 6, the fan 2 in a further embodiment includes a fan frame 63, a light-emitting unit, and an impeller 64.

The fan frame 63 may be, for example, rectangular. The outer surface of the fan includes a first end face 61 and a second end face 62 opposite to each other, for example, a front end face and a rear end face. The fan frame has a hollow portion penetrating the first end face 61 and the second end face 62 at its middle portion. The impeller 64 is installed in the hollow portion of the fan frame 63.

There are through holes 60 penetrating the first end face 61 and the second end face 62 at the four corners of the fan frame 63. In some other embodiments, the shape of the fan frame 63 is not limited to a rectangular shape, and may be designed as a cylindrical structure in other shapes as desired. And the fan frame may have four corners, or may have three corners, correspondingly, no structure is disposed at the fourth corner, that is, the fan frame is in the rectangular shape with one missing corner, like FIG. 1.

The light-emitting unit may include an LED 66 and LED wires 67, wherein the LED 66 is stalled in any one through holes 60 of the fan frame 63, and the other through holes 60 are mounting holes of the fan 2, for locking and fixing the fan frame. A head of the LED light 66 is exposed to the front end face 61, that is, the light emitted from the LED 66 can be radiated out of the fan from the front end face, and further, the head of the LED 66 may protrude from the first end face 61 (front end face). In another embodiment, for example, when the fan is installed in reverse, the head of the LED 66 may be exposed to the second end face 62 (rear end face). In some other embodiments, the head of the LED 66 may be completely accommodated in but not protrude out of the through hole 20, as long as the light emitted by the LED light 26 can be radiated out of the fan and play a function for displaying.

In this embodiment of the fan, the LED of the light-emitting unit are disposed in the through holes of the fan, so the fan has a light-emitting function without additional structure, it is particularly suitable for a switching power supply with a limited installation space and requiring a display function, especially for some switching power supplies with specialized size, for example, the CRPS power supply of 73.5 mm*38.5 mm, to place devices on the front panel.

A Further Embodiment of the Fan

Figure 7:
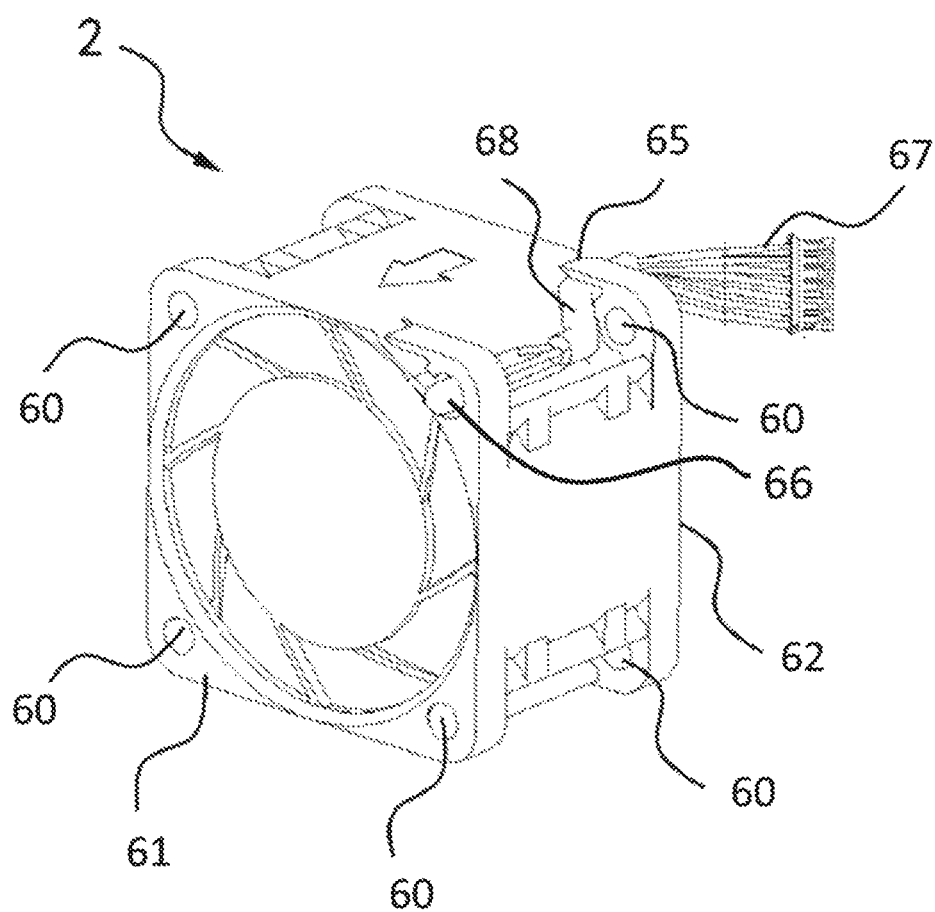
FIG. 7 is a schematic perspective structural view of a further embodiment of the fan according to the present disclosure.

Referring to FIG. 7, FIG. 7 is a schematic perspective structural view of a further embodiment of the fan according to the present disclosure. As shown in FIG. 7, the fan in the further embodiment includes a fan frame, a light-emitting unit and an impeller. The fan has different aspects as follows:

Each of the first end face 61 of the fan frame and the second end face 62 of the fan frame has four corners, and each of the corners is provided with a through hole 60. The LED 66 of the light-emitting unit may be disposed in any one or two through holes 60 of the first end face, or the LED 66 of the light-emitting unit may be disposed in any one or two through holes 60 of the second end face, and is exposed to the corresponding end face.

A threading groove 65 is further disposed on the fan frame, and an LED wires 67 is engaged in the threading groove 65. Preferably, the threading groove 65 and the LED 66 are respectively disposed on different end faces. As shown in FIG. 7, the LED 66 is disposed in the through hole 60 of the first end face 61, and the threading groove 65 is disposed on the second end face 62, such that it is more convenient to fix the LED wires 67, of course, the present disclosure is not limited thereto, and it is also feasible to provide the threading groove 65 and the LED 66 on the same end face.

Further, the fan in the another embodiment further includes a wire sleeve 68 wrapping the LED wires 67, such that it is more convenient to fix the plurality of LED wires 67 firmly.

The fan in the further embodiment has the other structures as the same as the previous embodiment, here, the details will be omitted.

A Further Embodiment of the Power Supply Device

Figure 8:
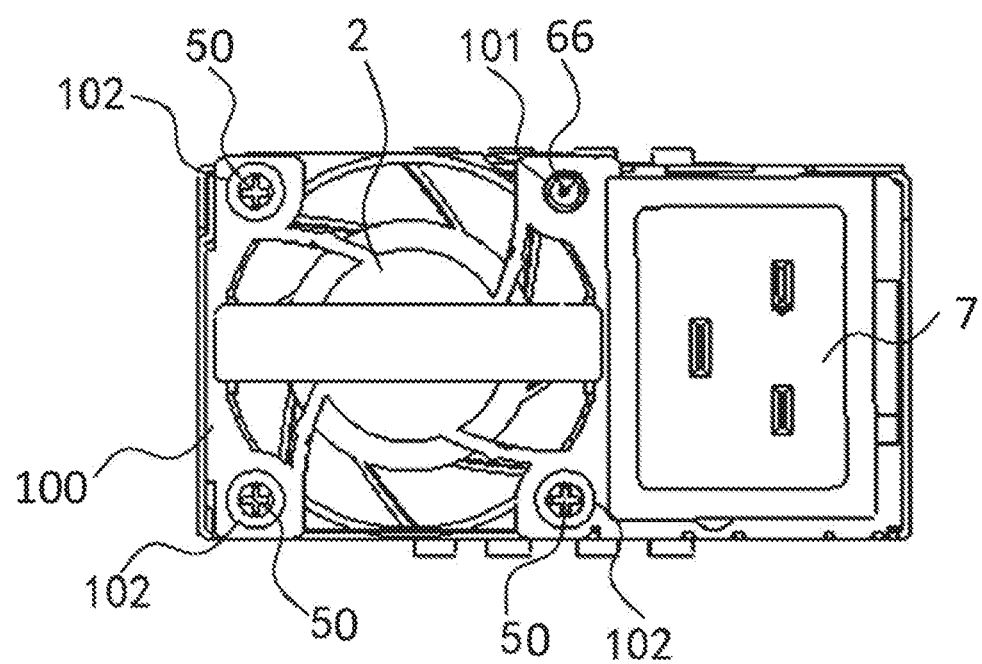
FIG. 8 is a schematic structural view of the power supply device of the present disclosure.

Referring to FIG. 8, FIG. 8 is a schematic structural view of the power supply device of the present disclosure. As shown in FIG. 8, the power supply device of the present disclosure includes an outer casing, a socket 7, and a fan 2.

The outer casing includes a bottom panel, two side panels, an upper cover plate, and a front panel 100. The socket 7 is fixed on the front panel 100, and the fan 2 is fixed with the front panel 100 and disposed side by side and adjacent to the socket 7. In detail, the first end face or the second end face of the fan 2 in which the LED 66 is mounted is attached to the front panel 100. The front panel 100 is provided with positioning holes 102. The mounting holes (the through holes 60 without being provided with the LED) on the fan 2 and the corresponding positioning holes 102 of the from panel 100 are fixed by a fastener 50 such as a screw, so that the fan 2 is installed and fixed on the front panel 100. Further, the front panel 100 is equipped with a light-transmitting hole 101 at a position corresponding to the LED 66, to ensure that the light emitted by the LED 66 radiates outwardly through the light-transmitting hole 101.

In one embodiment, the power supply device is a CRPS switch power supply of 73.5 mm*38.5 mm, and the socket 7 is a C20 socket. Since the fan is equipped with the light-emitting unit according to the present disclosure, it is not necessary to provide a separate installation space for the light-emitting unit.

The current carrying capacity of the switching power supply in this embodiment is increased without increasing the size of the power supply. As one aspect, the socket with higher-level power is applied to the switching power supply in accordance with the Intel CRPS specification by integrating the LED that can display the working state of the power supply into the fan. As the other aspect, the internal volume utilization of the switching power supply is effectively improved, and the power density of the power supply is upgraded.

The relativity words, such as "upper" or "lower", as used in the preceding embodiments, are directed to describe the relative relationship of the referenced component to another component. It should be appreciated that if the referenced device is inversed upside down, the component indicated as being the "upper" side would become the component on the "lower" side. The terms "include", "comprise" and "have", as used herein, are intended to be inclusive, and mean there may be additional elements/constituents/or the like other than the listed elements/constituents/or the like.

It should be understood that this disclosure would never be limited to the detailed construction and arrangement of components as set forth in this specification. This disclosure has other embodiments that can be practiced or carried out in various ways. The foregoing variations and modifications fall within the scope of this disclosure. It should be understood that this disclosure would contain all alternative combination of two or more individual features as mentioned or distinct from in the text and/or in the drawings. All of these different combinations constitute a number of alternative aspects of this disclosure. The embodiments as illustrated in this specification are the best modes known to achieve this disclosure and will enable one skilled in the art to realize this disclosure.

What is claimed is:

1. A fan for a power supply device, the power supply device comprises an outer casing, the outer casing has four sides, wherein two adjacent ones of the four sides intersect, thus forming four corners, wherein the fan comprises: a fan frame being circular and having three positioning holes adjacent to any three of the four corners of the outer casing, wherein the fan frame has no positioning hole adjacent to a remaining corner of the four corners of the outer casing which forms a reserved space.

2. The fan of claim 1, wherein the reserved space is a space for arranging wires.

3. The fan of claim 1, wherein the reserved space is configured to place an LED therein.

4. A fan for a power supply device, the power supply device comprises an outer casing, the outer casing has four sides, wherein two adjacent ones of the four sides intersect, thus forming four corners, wherein the fan comprises: a fan frame being circular and having two positioning holes adjacent to any two of the four corners of the outer casing, wherein the fan frame has no positioning holes adjacent to a remaining two of the four corners of the outer casing which forms two reserved spaces.

5. The fan of claim 4, wherein the reserved spaces are arranged for routing wires, or disposing an LED therein.

* * * * *